US012557239B2

(12) United States Patent
Rademacher et al.

(10) Patent No.: US 12,557,239 B2
(45) Date of Patent: Feb. 17, 2026

(54) ELECTRONIC CONTROL UNIT WITH SEPARABLE COOLING AND MEMORY MODULES

(71) Applicant: Aptiv Technologies Limited, St. Michael (BB)

(72) Inventors: Falk Rademacher, Gummersbach (DE); Martin Bornemann, Nuremberg (DE); Peter Reinhold, Gummersbach (DE)

(73) Assignee: Aptiv Technologies AG, Schaffhausen (CH)

( * ) Notice: Subject to any disclaimer, the term of this patent is extended or adjusted under 35 U.S.C. 154(b) by 133 days.

(21) Appl. No.: 18/169,704

(22) Filed: Feb. 15, 2023

(65) Prior Publication Data

US 2023/0292459 A1 Sep. 14, 2023

Related U.S. Application Data

(60) Provisional application No. 63/269,012, filed on Mar. 8, 2022.

(51) Int. Cl.
*H05K 7/20* (2006.01)
*H05K 5/00* (2025.01)

(52) U.S. Cl.
CPC ....... *H05K 7/20218* (2013.01); *H05K 5/0026* (2013.01)

(58) Field of Classification Search
CPC . H05K 7/20218; H05K 5/0026; H05K 5/0069
USPC ......................................................... 361/699
See application file for complete search history.

(56) References Cited

U.S. PATENT DOCUMENTS

| 6,396,692 B1* | 5/2002 | Farshi | H05K 7/20872 361/690 |
|---|---|---|---|
| 2017/0354048 A1* | 12/2017 | Harshbarger | F01N 9/00 |
| 2018/0093550 A1* | 4/2018 | Connell | F25B 43/006 |
| 2020/0287745 A1* | 9/2020 | Lavy | G06N 5/04 |

(Continued)

FOREIGN PATENT DOCUMENTS

| CN | 113071431 A | 7/2021 |
|---|---|---|
| CN | 114040853 A | 2/2022 |

(Continued)

OTHER PUBLICATIONS

"What is the battery charging system?", Jul. 1, 2019 (Wayback Machine Capture), Big O Tires, p. 1 (Year: 2019).*

(Continued)

*Primary Examiner* — Jayprakash N Gandhi
*Assistant Examiner* — Kyle Oxenknecht
(74) *Attorney, Agent, or Firm* — Miller Johnson

(57) ABSTRACT

An electronic control unit (ECU) with separable cooling and memory modules is described. The cooling module has an integrated liquid-cooling circuit with a direct connection to the cooling circuit. The memory module includes an independent memory that can store data and be tested independent of the cooling module. The cooling module and the memory module contact at thermal-contact surfaces to enable cooling when installed in a vehicle. In this way, the cooling module may provide cooling through the thermal-contact surface to one or more memory modules and the memory module may be implemented without an internal cooling system.

20 Claims, 9 Drawing Sheets

(56) References Cited

U.S. PATENT DOCUMENTS

2021/0212231 A1* 7/2021 Peterson .............. H01R 12/771
2022/0247013 A1   8/2022 Wedding

FOREIGN PATENT DOCUMENTS

WO      2022042102      3/2022
WO   WO-2022042102 A1 * 3/2022  ......... H05K 7/20254

OTHER PUBLICATIONS

"Flight Controls for Fixed Wing UAVs", May 6, 2020 (Wayback Machine Capture), UAV Navigation, p. 4 (Year: 2020).*
"Extended European Search Report", EP Application No. 23158953.2, Jul. 12, 2023, 15 pages.
Chinese Office Action received for CN App. No. 202310219670.1 dated Aug. 24, 2025, 18 pages.

* cited by examiner

ELECTRONIC CONTROL UNIT WITH SEPARABLE COOLING AND MEMORY MODULES

CROSS-REFERENCE TO RELATED APPLICATIONS

This application claims the benefit of U.S. Provisional Application Ser. No. 63/269,012, filed Mar. 8, 2022, the disclosure of which is incorporated by reference in its entirety.

BACKGROUND

Vehicles, such as automobiles, often include electronic control units (ECUs), which control systems within the vehicle. ECUs are both common and important, as modern vehicles may have many ECUs controlling many systems. These ECUs, due to their importance and their placement within a vehicle, are designed to handle environmental conditions that other computers and microcomputers are often not, such as vibration, high and low temperatures, and contaminants.

During manufacturing or post-manufacture inspections, data and programs may be uploaded to ECUs to enable the ECUs to control various systems. Current ECUs, however, can be difficult to inspect fully when the ECU is not yet integrated within the intended vehicle. After installation, however, inspection, upgrades, and repair can be difficult, as many ECUs include liquid-cooling circuits to aid in thermal dissipation, as high-temperature conditions are both common and detrimental to ECUs.

SUMMARY

Some examples of ECUs with separable cooling and memory modules are as follows:

Example 1. An electronic control unit (ECU) comprising: a cooling module comprising: a first electrical connection; a liquid-cooling circuit; and a first thermal-contact surface in thermal connection with the liquid-cooling circuit, the first thermal-contact surface configured to contact a second thermal-contact surface of a memory module to provide thermal connection between the liquid-cooling circuit and the memory module; and the first electrical connection configured to communicatively couple the memory module through a second electrical connection of the memory module to provide electrical communication between the cooling module and the memory module.

Example 2. The ECU of Example 1, further comprising the memory module, the memory module separable from the cooling module through one or more physical-connection elements, the memory module comprising: memory; the second electrical connection communicatively coupling the memory module and the cooling module; and the second thermal-contact surface in thermal contact with the first thermal-contact surface.

Example 3. The ECU of Example 2, wherein the memory module does not include a liquid-cooling circuit.

Example 4. The ECU of Example 2, wherein the cooling module comprises one or more computer processors and the memory of the memory module comprises processor-executable instructions that, responsive to execution by the computer processors of the cooling module, perform control functions to control one or more systems within a vehicle.

Example 5. The ECU of Example 2, wherein the second electrical connection is configured to receive power and sensor data from the cooling module, and wherein the memory module does not include a vehicle electrical connection.

Example 6. The ECU of Example 1, wherein the cooling module comprises one or more vehicle electrical connections configured to couple the cooling module to a vehicle.

Example 7. The ECU of Example 6, wherein the one or more vehicle electrical connections are further configured to enable receipt of power from the vehicle, receipt of sensor data from the vehicle, and provision of control functions to the vehicle.

Example 8. The ECU of Example 1, wherein the cooling module further comprises a coolant-circulation connector configured to receive and expel a coolant to and from the liquid-cooling circuit.

Example 9. An electronic control unit (ECU) comprising: a memory module comprising: a first electrical connection; a memory; one or more computer processors; and a first thermal-contact surface, the first thermal-contact surface configured to contact a second thermal-contact surface, the second thermal-contact surface of a cooling module to provide thermal connection between a liquid-cooling circuit of the cooling module and the memory module; and the first electrical connection configured to communicatively couple the memory module to the cooling module through a second electrical connection of the cooling module.

Example 10. The ECU of Example 9, further comprising the cooling module, the cooling module and the memory module physically connected but separable from each other through one or more physical-connection elements, the cooling module comprising: the cooling circuit; the second electrical connection communicatively coupling the memory module and the cooling module; and the second thermal-contact surface in thermal contact with the first thermal-contact surface.

Example 11. The ECU of Example 9, wherein the memory module does not include the liquid-cooling circuit or another liquid-cooling circuit.

Example 12. The ECU of Example 9, wherein the memory of the memory module comprises processor-executable instructions that, responsive to execution by the one or more computer processors, perform control functions to control one or more systems within a vehicle.

Example 13. The ECU of Example 12, wherein the one or more systems within the vehicle is an assisted-driving system, and wherein the control functions enable self-driving or assisted-driving of the vehicle.

Example 14. The ECU of Example 12, wherein the one or more systems within the vehicle is a braking system, and wherein the control functions enable automatic braking or electronic stability control of the vehicle.

Example 15. The ECU of Example 12, wherein the one or more systems within the vehicle is a battery-management system, and wherein the control functions enable battery charging or battery-life extension.

Example 16. The ECU of Example 12, wherein the one or more systems within the vehicle is a flight navigation system, and wherein the control functions enable auto-pilot functions.

Example 17. The ECU of Example 12, wherein the one or more systems within the vehicle is a radar or lidar system, and wherein the control functions enable processing of a radar or lidar signal.

Example 18. The ECU of Example 9, wherein the memory module does not include a vehicle electrical connection and communicative coupling with a vehicle is received through the second electrical connection of the cooling module.

Example 19. The ECU of Example 18, wherein the memory module includes one or more vehicle electrical connections and communicative coupling with the vehicle is received through the one or more vehicle electrical connections.

Example 20. The ECU of Example 19, wherein the one or more vehicle electrical connections are further configured to enable receipt of power from the vehicle, receipt of sensor data from the vehicle, and provision of control functions from the memory module to the vehicle.

BRIEF DESCRIPTION OF THE DRAWINGS

The details of one or more aspects of a described ECU with separable cooling and memory modules are described below. The use of the same reference numbers in different instances in the description and the figures indicate similar elements.

DETAILED DESCRIPTION

Overview

Figure 1A:
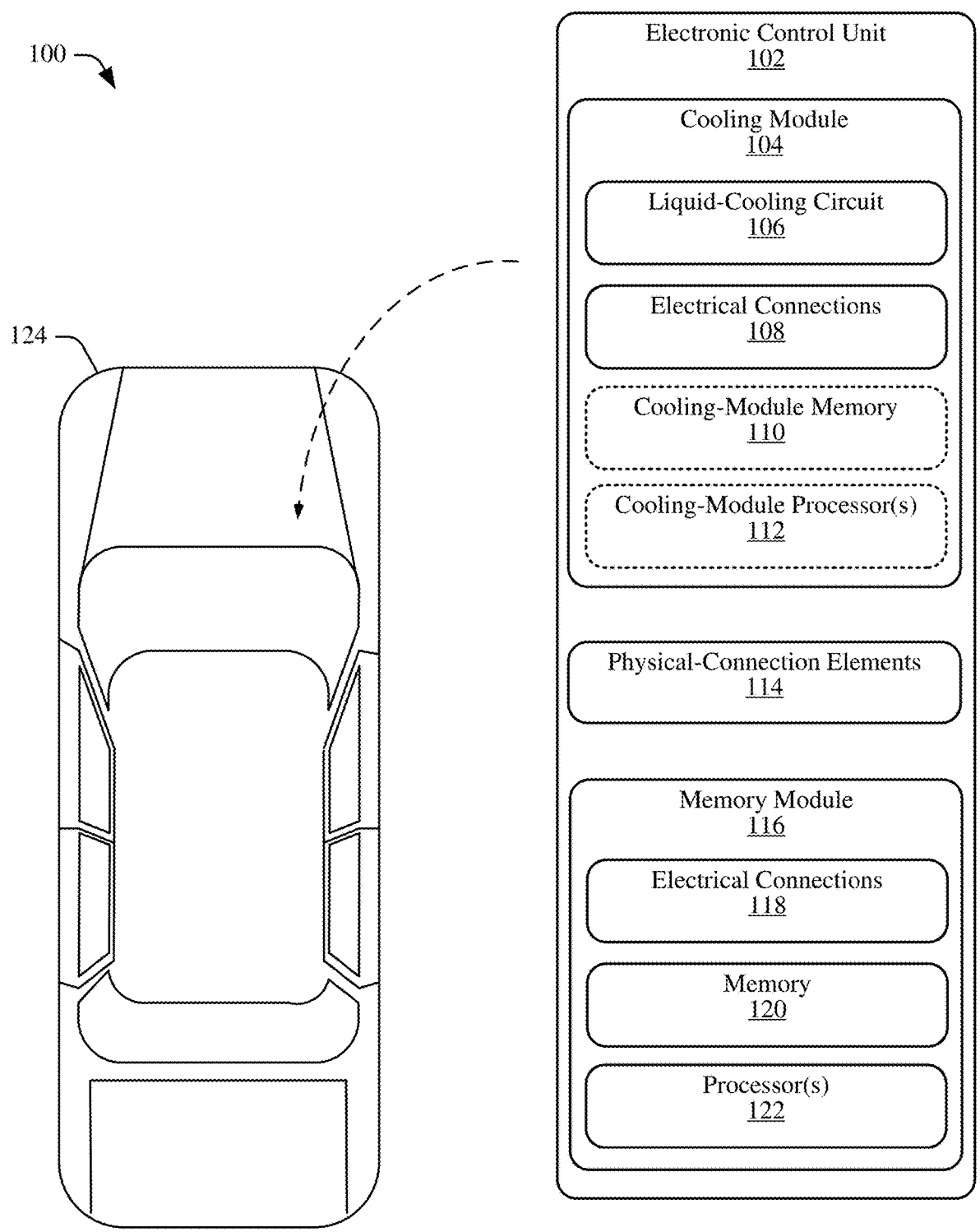
FIGS. 1A and 1B illustrate example operating environments for an ECU having separable cooling and memory modules.

Electronic control units (ECUs) are often installed in vehicles to perform control functions by which to control various systems within a vehicle. Example systems include a vehicle's powertrain, engine, transmission, braking (e.g., electronic stability control and/or automatic braking system), battery-management system (e.g., charging and/or life extension), speed control, assisted-driving systems (e.g., self-driving or assisted driving), suspension, flight navigation (e.g., auto-pilot), radar and/or lidar systems and processing of signal thereof, all-wheel drive, and air-bag deployment systems to name but a few of the many systems controllable by ECUs.

To enable these control functions, ECUs may require data to be uploaded to memory within the unit. In general, this data may be uploaded during manufacture, during inspections, or after a malfunction is detected and servicing is performed. The ECU may include one or more electrical connectors, which enables data to be uploaded to memory within the ECU. However, these connectors are often located in difficult-to-access portions of the ECU due to complex design requirements that ECUs satisfy.

In addition to design complexities related to data requirements, ECUs may be required to meet certain thermal requirements. For example, when an ECU performs control functions, the temperature of the ECU may increase, potentially damaging components of the ECU and negatively impacting performance. To aid in thermal dissipation to control ECU temperature, some ECUs may be implemented with liquid-cooling circuits. In general, these liquid-cooling circuits are implemented within the ECU, thus adding to the complexity of ECU designs. Moreover, when replacement or repair of the ECU is needed, the liquid-cooling circuit that enables cooling may need to be emptied, which can be a technical and laborious process. Thus, repair and replacement of ECUs may be an expensive and difficult process that requires an experienced technician.

While ECU designs may create challenges in servicing automobiles, ECU requirements may also limit the efficiency and simplicity of manufacture. In the manufacture of some ECUs, data is uploaded before a cooling circuit is filled with coolant. In some instances, this is because a cooling substance (e.g., coolant) is provided by the automobile in which the ECU is installed. In this way, data tests that occur pre-installation may be limited in testing time due to thermal issues that arise when the liquid-cooling system (e.g., the circuit and/or connected greater cooling apparatus to which the circuit is attached) is disabled. In other examples, data upload times during manufacture may cause inefficiencies in the manufacturing of ECUs. Specifically, data uploads at the time of manufacture may force delays in assembly lines due to the time required to transmit and store data within an ECU.

In contrast to current ECU designs, the described ECU is implemented to enable at least two modules (e.g., one cooling module and one or more memory modules). In aspects, the cooling module has an integrated liquid-cooling circuit with a direct connection to the cooling circuit and the electrical network provided by the automobile, although other types of cooling are contemplated herein. The memory module includes an independent memory that can store data and be tested independent of the cooling module. The cooling module and the memory module contact at a cooling surface when installed in the automobile. In this way, the cooling module may provide cooling through the contact surface to one or more memory modules and the memory module may be implemented without an internal cooling system.

In aspects, the memory module does not include an independent liquid-cooling supply and is cooled only through the cooling system of the cooling module. Thus, no work may be required to alter the cooling system when repair or replacement is required on the memory module. To aid in cooling, the memory module may have a cooling surface with a simple, and in some instances, flat shape. In this way, the memory module may be coupled to any other cooling surface when removed from the cooling module, for example, during testing and manufacturing. In general, this cooling surface may be in contact with (or be proximate to) a cooling surface of the cooling module when the memory module is coupled to the cooling module. The memory module may be secured through one or more fixing elements to mechanically couple the cooling module and the memory module. The memory module may be communicatively coupled to the cooling module through an electrical connection.

The memory module may be designed to support a large, writable portion of memory. In this way, the memory module may be independently uploaded with the relevant data required to perform many or all of the control functions for which the ECU is responsible, and the manufacturing process of the memory module may be independent of the manufacture of the cooling module. In some implementations, the memory module may have electronic connections to couple to the electronic network of the automobile. In this way, the memory module may communicatively couple to the cooling module and the automobile itself. Further, by implementing the memory module as a peripheral of the cooling module instead of within the cooling module itself, servicing portions of the memory module may require removal of, or access to, the memory module only, thus reducing the cost and expertise required to update or service data stored in the memory module. Moreover, memory modules may be serviced or replaced when software or version changes are made without forcing repair or replacement of the cooling module. By reducing servicing and manufacturing constraints, separately implementing memory of the cooling module and the memory module may increase an ECU's security. As such, the ECU described herein may be easier to manufacture, easier to repair/replace, and more secure.

Example Operating Environment

FIG. 1A illustrates an example operating environment 100 for an ECU 102. In aspects, the ECU may include a cooling module 104 with a liquid-cooling circuit 106 and electrical connections 108. The liquid-cooling circuit 106 may couple to a larger vehicle cooling circuit (not shown) that supplies coolant (water or other liquid or gas) to the liquid-cooling circuit 106 (which may include water and/or another form of coolant). The liquid-cooling circuit 106 is configured to circulate coolant to aid in thermal dissipation of the ECU 102. In some implementations, the cooling module 104 may include memory (e.g., cooling-module memory 110) to store data or programs that are to be executed by the ECU 102, here optionally in whole or in part by at least one cooling-module processor 112.

As noted in part above, the cooling module 104 can be physically connected to but later separated from, such as through physical-connection elements 114, one or more memory modules 116. The cooling module 104 and the memory module 116 may physically couple at one or more contact surfaces and may be mechanically fixed to one another though the physical-connection elements 114. For example, each of the one or more memory modules 116 can be separated from the cooling module 104 to aid in easily testing, fixing, replacing, or updating the memory module 116.

The memory module 116 includes electrical connections 118, memory 120, and one or more processor(s) 122. Data may be transferred between the memories of the ECU 102, such as between the memory 120 and the cooling-module memory 110 of the cooling module 104 through the electrical connections 108 and 118. These electrical connections 108 and 118 may also be used to transfer data from and/or about the vehicle 124 and its systems, in addition to data between the memories of the ECU 102. Additionally or alternatively, power may be provided to the ECU 102 through the electrical connections 108 and/or 118. In aspects, power may be provided to the memory module 116 through the electrical connections 108 to the electrical connections 118 (e.g., from the cooling module 104 or a vehicle 124 to the memory module 116). Data may be transferred between the vehicle 124 or the vehicle systems, the cooling module 104, and/or the memory module 116 through the electrical connections. In some implementations, the electrical connections include universal serial bus (USB) ports, coaxial cable ports, and other serial or parallel connectors (including internal connectors) useful to couple the electronic device to various components, peripherals, or accessories. The electrical connectors may be used to transfer data or programs to the ECU 102, the cooling module 104, or the memory module 116. In aspects, the electrical connections may include board-to-board connectors, cable/wire-to-cable/wire connectors, and cable/wire-to-board connectors. Moreover, the electrical connections may supply power to the ECU 102, the cooling module 104, or the memory module 116, as well as sensor data, and other information from and/or about the vehicle 124 and its systems. As such, the electrical connections may include AC (alternating current) connectors or DC (direct current) connectors.

The memory 120 and/or the cooling-module memory 110 of the cooling module 104 may include any suitable type of memory media or storage media (e.g., read-only memory (ROM), programmable ROM (PROM), random access memory (RAM), dynamic RAM (DRAM), static RAM (SRAM), or Flash memory). In the context of this discussion, the memory of the ECU 102 is implemented as at least one hardware-based or physical storage device, which does not include transitory signals or carrier waves. Applications, firmware, and/or an operating system (not shown) of the ECU 102 can be embodied on the memory as processor-executable instructions, which may be executed by either of the processors or processor groups of the ECU 102 or systems within the vehicle 124 (e.g., cooling-module processors 112, processors 122). The memory may also store device data, such as user data or user media that is accessible through the applications, firmware, or operating system of the ECU 102. By so doing, the cooling module 104 and/or the memory module 116 may include, or be coupled to, at least one processor (not shown) to execute instructions stored in the memory of the cooling module 104 or the memory module 116 to control one or more systems of the vehicle 124.

The cooling module 104 and/or the memory module 116 may be implemented within the vehicle 124 (e.g., after manufacture and initial testing). The physical-connection elements 114 may include various types of connectors, including those to physically couple the cooling module 104 and/or the memory module 116 to the vehicle 124 (these may be different connectors and elements than those connecting the cooling module 104 and the memory module 116).

Though illustrated as a passenger car, the vehicle 124 could include any other vehicle (e.g., a passenger truck, a commercial truck, an aircraft, a watercraft, a spacecraft, an autonomous vehicle, a semi-autonomous vehicle, and the like). The vehicle 124 may include an engine on which the ECU 102 may perform one or more control functions. In some implementations, the ECU 102 communicatively couples to one or more systems of the vehicle 124 and may perform control functions based on data received from the one or more systems. The ECU 102 may couple or include one or more sensors to determine various characteristics of the engine. In some aspects, the ECU 102 may perform control operations to adjust operations of the engine based on the data received from the one or more sensors. Additionally or alternatively, the ECU 102 may couple to one or more communication systems that output errors/notifications to either a user or systems of the vehicle 124.

In other implementations, the ECU 102 may be implemented within any system that includes an engine, such as an internal combustion engine or an electrical engine. The engine may be deployed in a mobile or immobile platform.

Figure 1B:
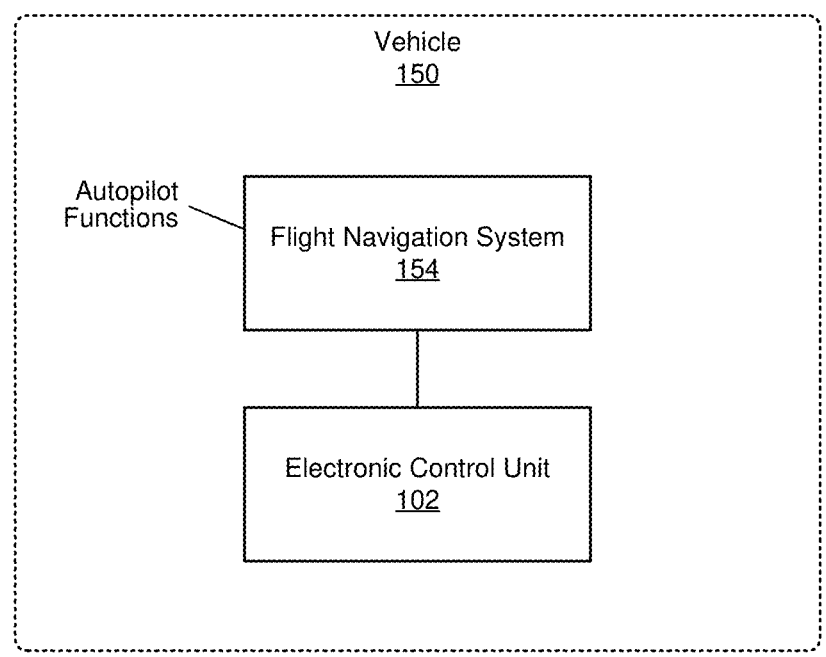

FIG. 1B illustrates another example operating environment 140 for the ECU 102. A vehicle 150 includes a flight navigation system 154. The ECU 102 includes processor-executable instructions that, responsive to execution by one or more computer processors, perform control functions, such as auto-pilot functions, to control the flight navigation system 154.

Figure 2:
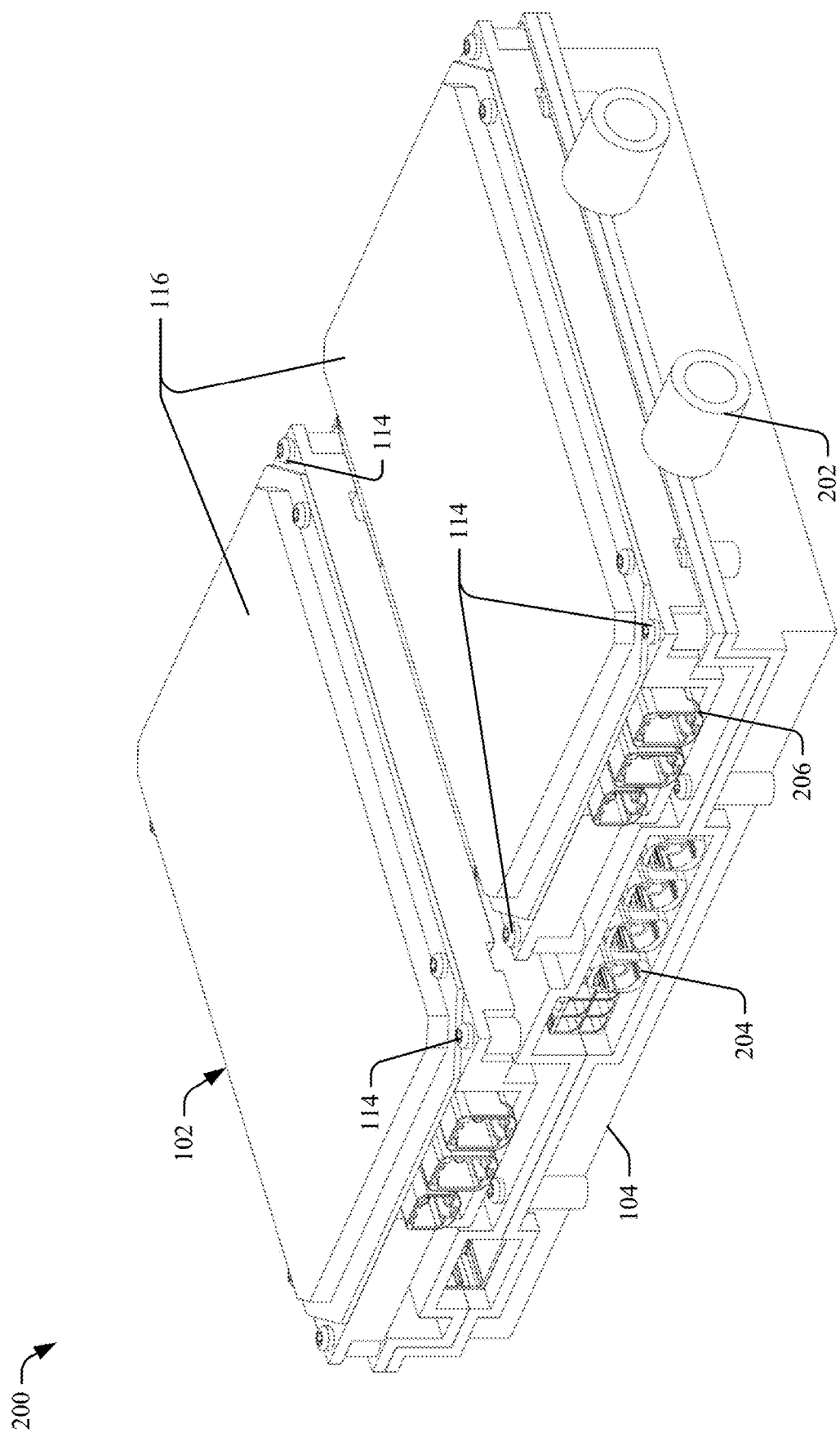
FIG. 2 illustrates an example assembled view of an ECU having a cooling module and two memory modules.

FIG. 2 illustrates an example assembled view 200 of an ECU 102 with one cooling module 104 and two memory modules 116. In aspects, the view 200 illustrates the cooling module 104 coupled to the memory module 116 through physical-connection elements 114 (e.g., mechanical fasteners). The cooling module 104 may include a coolant-circulation connector 202 through which coolant is supplied (e.g., into and expelled from) by the vehicle 124 to the cooling module 104 through the liquid-cooling circuit 106 (not shown in FIG. 2). The cooling module 104 may include one or more vehicle electrical connections 204 (e.g., an example of the electrical connections 108). The vehicle electrical connections 204 may be used to couple the cooling module 104 to the electrical system provided by the vehicle. The electrical connections 204 may provide/receive sensor data and control functions to/from the vehicle. In some implementations, the vehicle electrical connections 204 provide power to the cooling module 104.

The memory modules 116 may each include vehicle electrical connections 206 (e.g., an example of the electrical connections 118) that couple to the vehicle 124. Similar to the vehicle electrical connections 204, the vehicle electrical connections 206 may be used to provide/receive data or power to/from the memory module 116. In some implementations, the vehicle electrical connections 206 are used to upload data to the memory module 116 during manufacture.

Figure 3:
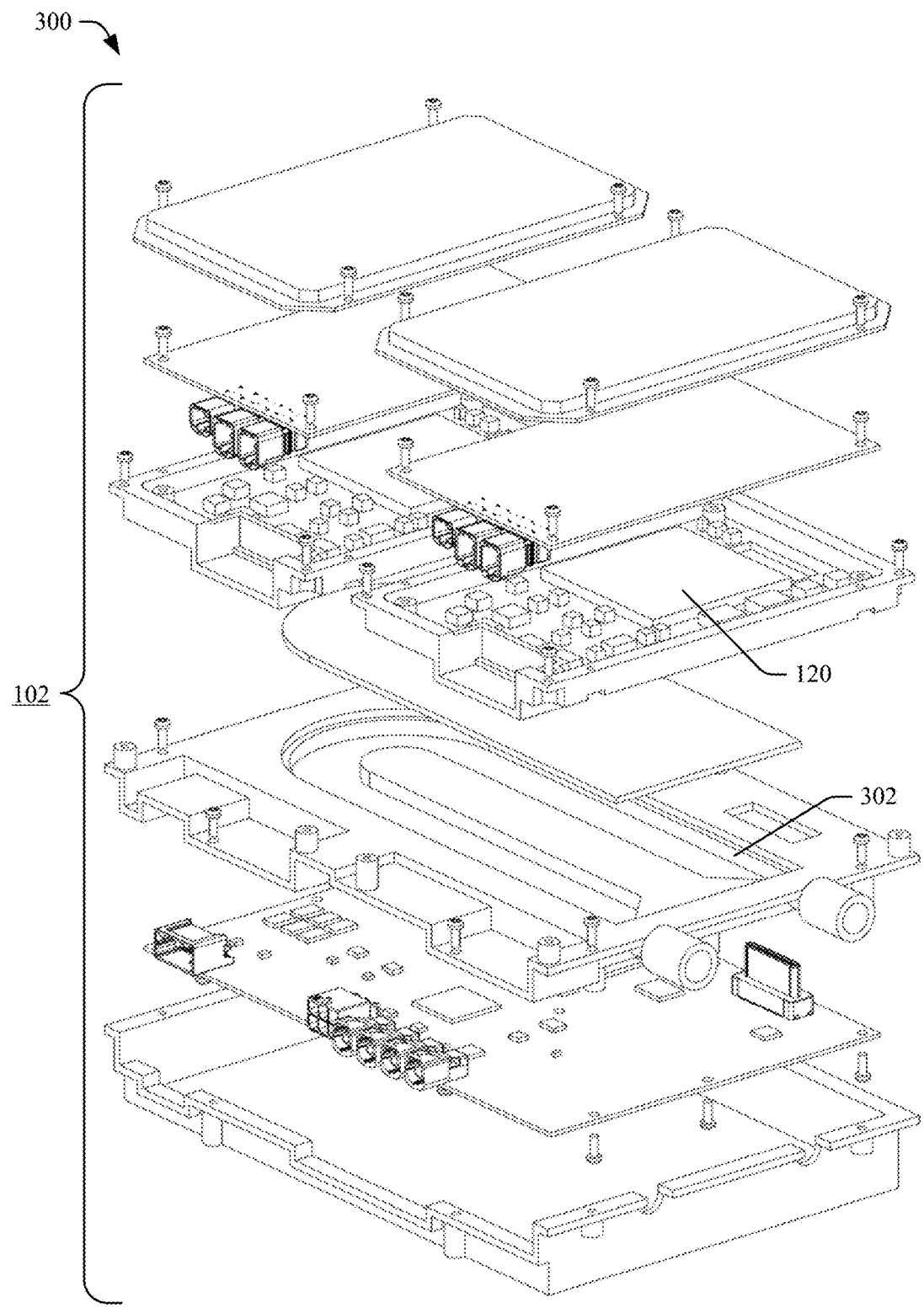
FIG. 3 illustrates an example exploded trimetric view of an ECU having a cooling module and two memory modules.

FIG. 3 illustrates an exploded trimetric view 300 of an ECU 102 with a cooling module 104 and two memory modules 116. In aspects, each of the memory modules 116 may include at least one independent memory, e.g., memory 120 of FIG. 1A. The memory 120 may be independent of the cooling module 104 and may store data that is uploaded during the manufacture of the ECU 102 or of the memory module 116. In this way, the data transfer time required to upload data to the memory module 116 may be decoupled from the manufacture of the cooling module 104. Further, generational updates may be more-easily uploaded to the memory module 116 independent of the cooling module 104. In aspects, this may allow for simple repair/updates and more detailed manufacture that can better improve the ECU's 102 resistance to attacks (e.g., improve security). Although illustrated with the single cooling module 104 and two memory modules 116, the ECU 102 may include a single memory module or a different quantity of multiple memory modules. In some implementations, the ECU 102 is implemented using many memory modules, each memory module configured to enable a specific function or group of functions, for example.

Also illustrated in FIG. 3 is an interior view 302 of a liquid-cooling circuit 106. In aspects, the liquid-cooling circuit 106 is used to transport coolant through the ECU 102. The liquid-cooling circuit 106 may be located near a cooling surface of the cooling module 104 to aid in thermal cooling of the memory module (described later below).

Figure 4:
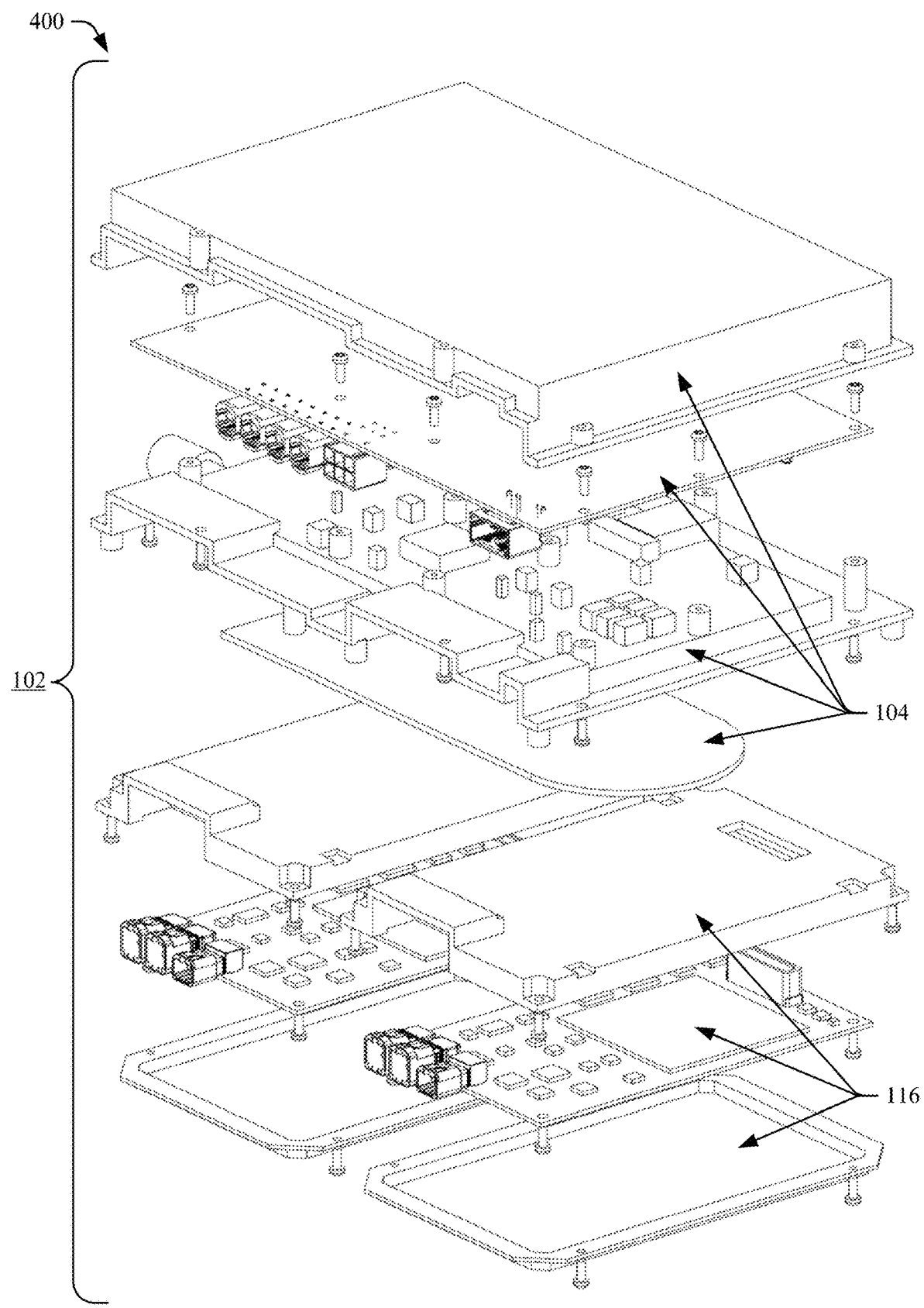
FIG. 4 illustrates an example upside-down, exploded trimetric view of an ECU having a cooling module and two memory modules.

FIG. 4 illustrates an example upside-down, exploded trimetric view 400 of an ECU 102 with a cooling module 104 and two memory modules 116 for additional context.

Figure 5:
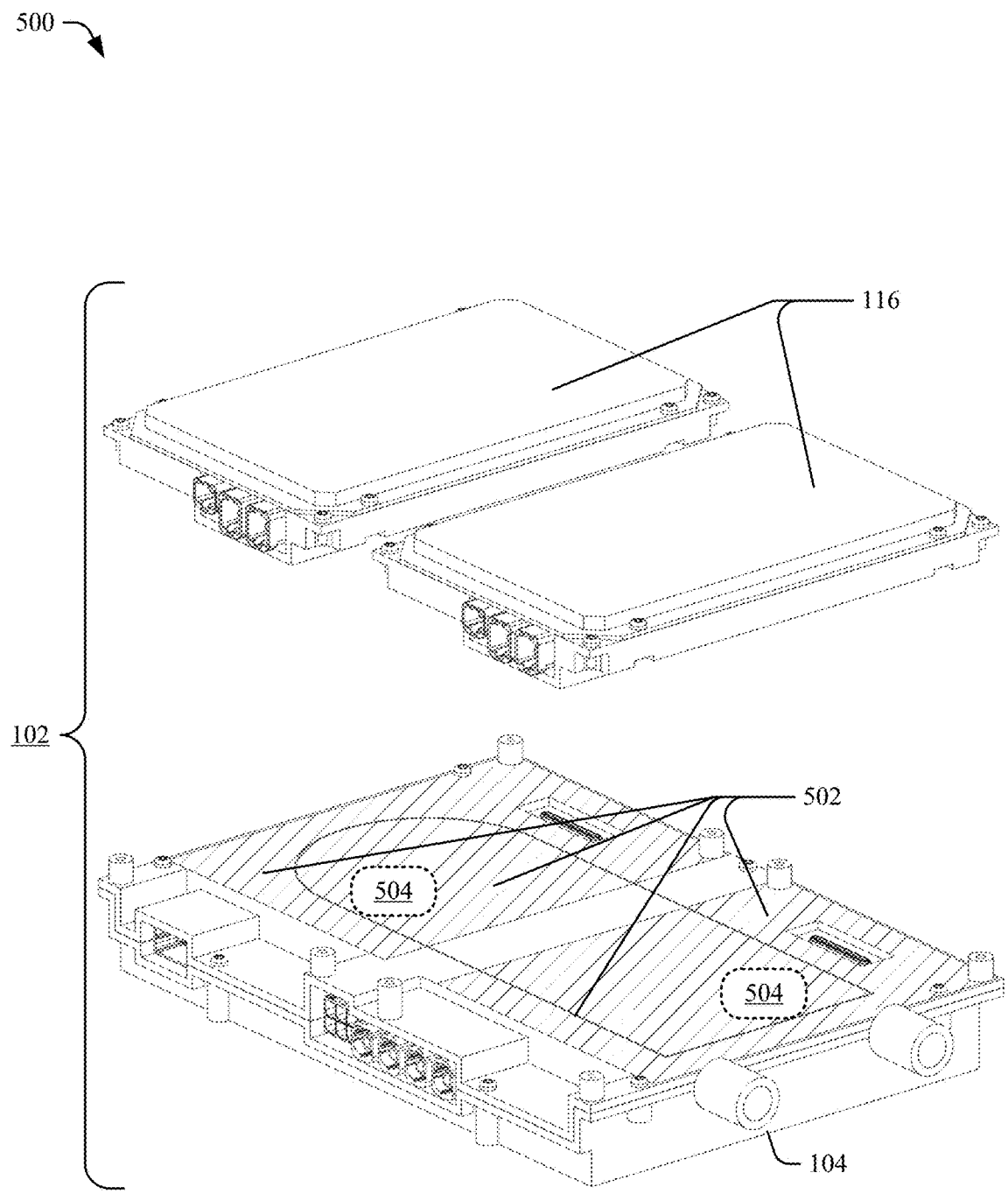
FIG. 5 illustrates an example pre-assembled trimetric view of an ECU having a cooling module and two memory modules, the cooling module shown with a thermal-contact surface.

FIG. 5 illustrates an example pre-assembled trimetric view 500 of an ECU 102 with a cooling module 104 and two memory modules 116, with a parallel-line-marked thermal-contact surface 502. The liquid-cooling circuit 106 (not shown, but largely beneath arced area 504; e.g., see FIG. 3 at 302) may be located near or in direct contact with the thermal-contact surface 502 of the cooling module 104. By being located in this way, the thermal-contact surface 502 provides thermal connection with the liquid-cooling circuit 106. In this way, the liquid-cooling circuit 106 of the cooling module 104 may act as the cooling system of the memory module 116. For example, the thermal-contact surface 502 may be located at a contact face between the cooling module 104 and the memory module 116. As such, the memory module 116 may forgo a liquid-cooling circuit, and thermal cooling may be facilitated through the liquid-cooling circuit 106 of the cooling module 104. By removing the need for a liquid-cooling circuit from the memory module 116, repairs to the memory module 116 may not require altering the liquid-cooling circuit 106 (e.g., draining the system of coolant). In this way, upload, repair, or replacement of the memory module 116 may be simplified.

In some implementations the thermal-contact surface 502 may be designed with a simple, flat shape. In this way, the cooling module 104 may be tested with relatively low risk of thermal failure or damage by placing the cooling module 104 on a cooling system in such a way that the thermal-contact surface 502 is proximate to the cooling system. Through this placement, the cooling module 104 may be further tested during manufacture or repair without damaging the cooling module 104 due to excess heat, even when the liquid-cooling circuit 106 is not filled with coolant.

Figure 6:
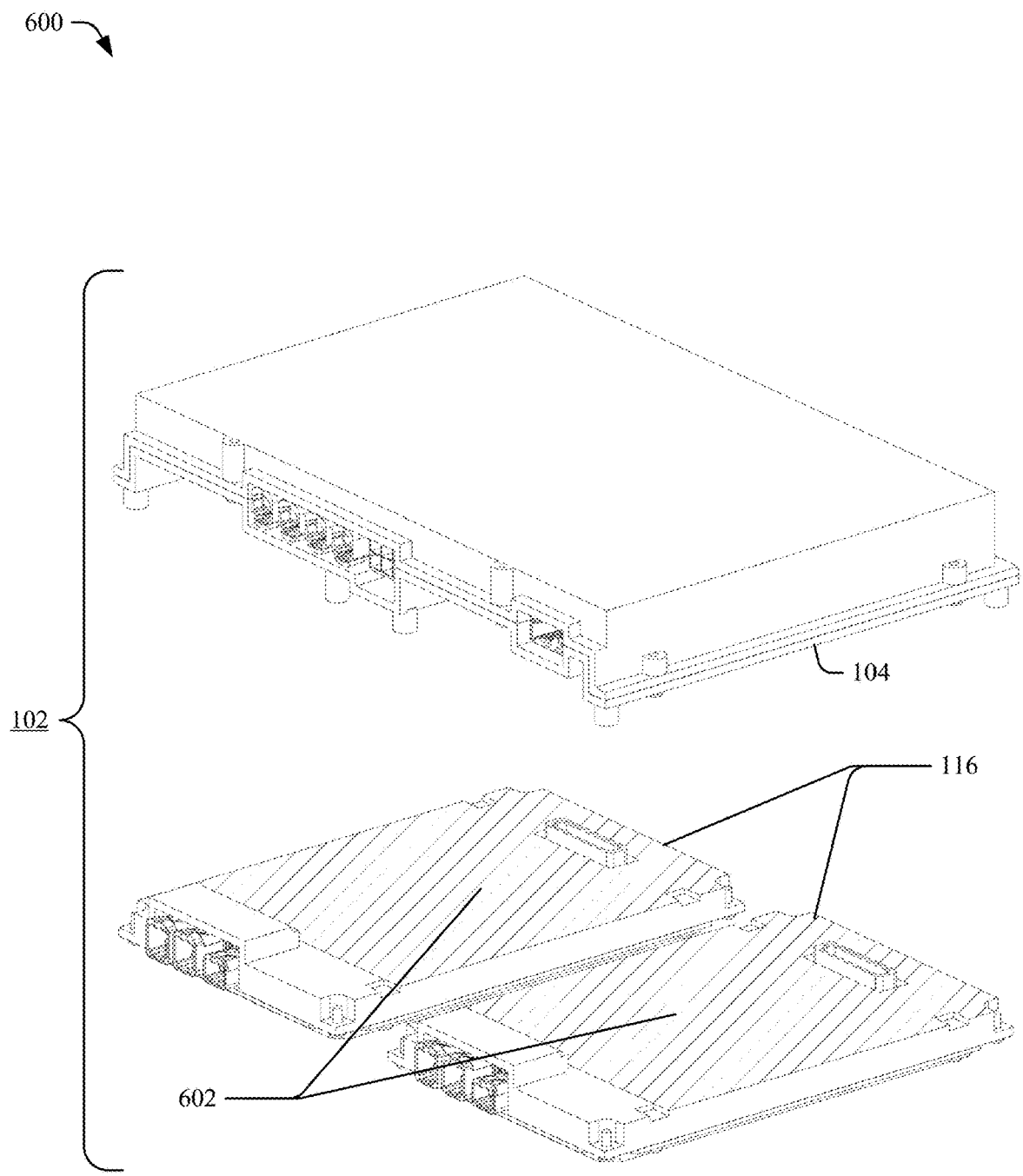
FIG. 6 illustrates an example pre-assembled trimetric view of an ECU having a cooling module and two memory modules, the memory modules each shown with a thermal-contact surface.

FIG. 6 illustrates an example pre-assembled trimetric view 600 of an ECU 102 with a cooling module 104 and two memory modules 116, with parallel-line-marked thermal-contact surfaces 602 (one surface for each of the two memory modules 116). The memory modules 116 may include a thermal-contact surface 602, which can be placed into separable contact with the thermal-contact surface 502 of the cooling module 104 (see FIG. 5). Like the thermal-contact surface of the cooling module 104 (see FIG. 5 at 502), the thermal-contact surface 602 may be implemented with a simple, flat shape (although this is not required). In this way, the memory module 116 may be placed on many simple cooling systems to aid in thermal dissipation (e.g., flat and having dimensions between projecting structures at opposing ends, such as the various electrical connections). During manufacture or repair, this placement may enable the memory module 116 to be better tested (e.g., for a longer-duration and under higher-stress conditions) with lower risk of thermal failure or damage, even when the memory module 116 does not include an internal cooling system.

Figure 7:
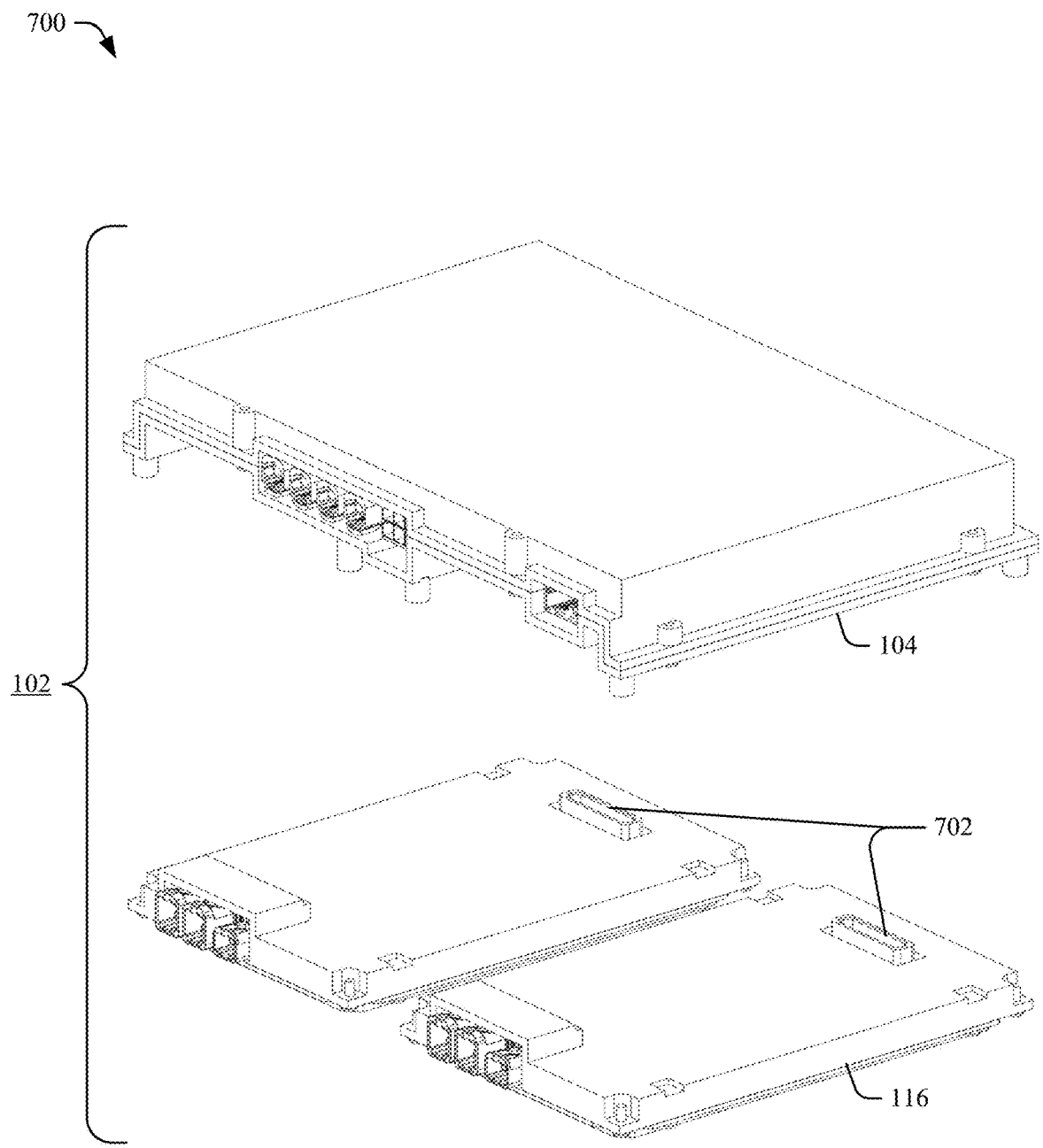
FIG. 7 illustrates an example upside-down, pre-assembled trimetric view of an ECU having a cooling module and two memory modules and electrical connections to couple the cooling module and the memory modules.

FIG. 7 illustrates an example upside-down, pre-assembled trimetric view 700 of an ECU 102 with a cooling module 104 and two memory modules 116. In aspects, the view 700 illustrates the ECU 102 with the cooling module 104 and the memory module(s) 116 decoupled. When coupled, the cooling module 104 and the one or more memory modules 116 may communicate through electrical connections 702, respectively or in combination. In aspects, the electrical connections 702 may couple to the electrical connections of the cooling module 104. In this way, the memory module 116 may communicate the data stored in the memory 120 (within the memory module 116) to the cooling module 104 to enable the cooling module 104 to perform various control functions. In some implementations, the cooling module 104 may provide power to the memory module 116 through the connections 702. As such, the memory module 116 may be independent of a direct power connection of the vehicle, further enabling simple removability of the memory module 116.

Figure 8:
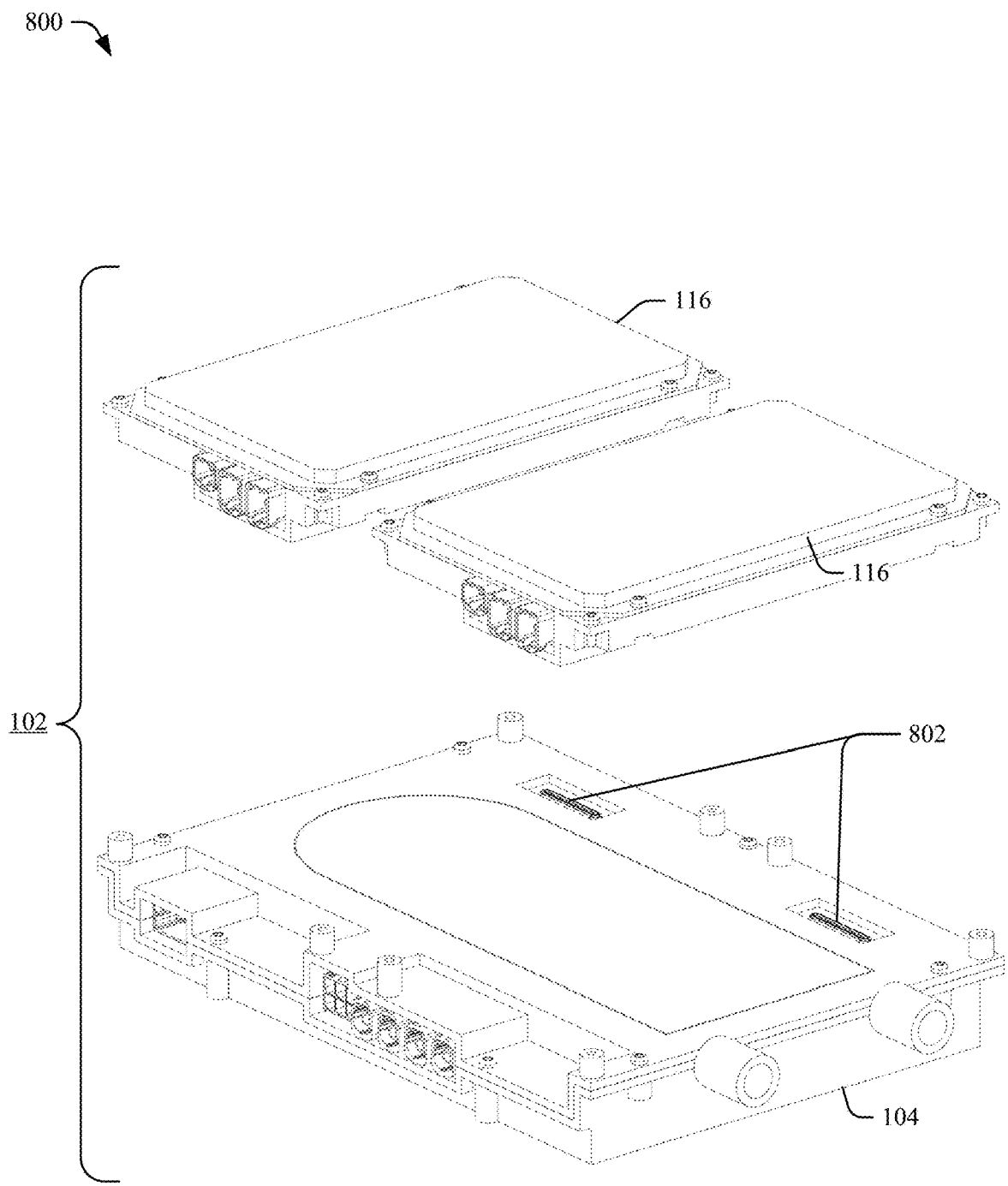
FIG. 8 illustrates an example pre-assembled trimetric view of an ECU having a cooling module and two memory modules and electrical connections to couple the cooling module and the memory modules.

FIG. 8 illustrates an example, pre-assembled trimetric view 800 of an ECU 102 with decoupled cooling module 104 and two memory modules 116. Each of the memory module(s) 116, as shown, may be removed from the cooling module 104 to enable individual repair or replacement. In doing so, repair or replacement may be simplified, and the cost of repair or replacement may be lowered. Additionally, the cooling module 104 and the one or more memory modules 116 may be manufactured independently and assembled after manufacture. In this way, the manufacture process of the ECU may be decoupled from the data transmission time, and the ECU may be produced more efficiently. Moreover, the memory module 116 may undergo greater testing without reducing manufacturability, thus increasing reliability and security of the ECU.

When the cooling module 104 and the memory module 116 are coupled together, electrical connections 802 may enable communications between the cooling module 104 and the memory module 116. In some implementations, data and/or power may be transferred between the cooling module 104 and the memory module 116 through the electrical connections 802. Specifically, the electrical connections 802 may couple to the electrical connections of the memory module 116 (e.g., to electrical connections 702 (FIG. 7)). In this way, the cooling module 104 may execute programs stored within the at least one memory module 116 to perform various control functions, such as those described herein.

CONCLUSION

Although aspects of the described ECU with a separable cooling module and memory module have been described in language specific to features and/or methods, the subject of the appended claims is not necessarily limited to the specific features or methods described. Rather, the specific features and methods are disclosed as example implementations of the described ECU, and other equivalent features and methods are intended to be within the scope of this disclosure. Further, various aspects of an ECU with a separable cooling module and memory module are described, and it is to be appreciated that each described aspect can be implemented independently or in connection with one or more other described aspects.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

What is claimed is:

1. An electronic control unit (ECU) comprising a cooling module including:
    a first electrical connection;
    a housing;
    a liquid-cooling circuit; and
    a first thermal-contact surface in thermal connection with the liquid-cooling circuit, wherein:
        the first thermal-contact surface is configured to contact a second thermal-contact surface of a memory module to provide thermal connection between the liquid-cooling circuit and the memory module,
        the housing is independent of a housing of the memory module,
        the cooling module is configured to be separable from the memory module without emptying liquid from the liquid-cooling circuit,
        the cooling module is separable from the memory module through one or more physical-connection elements, and
        the first electrical connection is configured to communicatively couple the memory module through a second electrical connection of the memory module to provide electrical communication between the cooling module and the memory module.

2. The ECU of claim 1, further comprising the memory module, wherein:
    the memory module includes:
        memory;
        the second electrical connection; and
        the second thermal-contact surface,
    the second electrical connection is configured to communicatively couple the memory module and the cooling module, and
    the second thermal-contact surface is in thermal contact with the first thermal-contact surface.

3. The ECU of claim 2, wherein the memory module does not include a liquid-cooling circuit.

4. The ECU of claim 2, wherein:
    the cooling module includes one or more computer processors, and
    the memory of the memory module stores processor-executable instructions that, responsive to execution by the one or more computer processors of the cooling module, perform control functions to control one or more systems within a vehicle.

5. The ECU of claim 2, wherein:
    the second electrical connection is configured to receive at least one of power or sensor data from the cooling module, and
    the memory module does not include a vehicle electrical connection.

6. The ECU of claim 1, wherein the cooling module includes one or more vehicle electrical connections configured to couple the cooling module to a vehicle.

7. The ECU of claim 6, wherein the one or more vehicle electrical connections are further configured to enable at least one of receipt of power from the vehicle, receipt of sensor data from the vehicle, or provision of control functions to the vehicle.

8. The ECU of claim 1, wherein the cooling module includes a coolant-circulation connector configured to receive and expel a coolant to and from the liquid-cooling circuit.

9. An electronic control unit (ECU) comprising:
a memory module including:
   a memory module electrical connection;
   a housing;
   a memory;
   one or more computer processors; and
   a memory module thermal-contact surface,
wherein:
   the memory module thermal-contact surface is configured to contact a thermal-contact surface of a cooling module,
   the cooling module thermal-contact surface is configured to provide thermal connection between a liquid-cooling circuit of the cooling module and the memory module,
   the housing is independent of a housing of the cooling module,
   the memory module is configured to be separable from the cooling module without emptying liquid from the liquid-cooling circuit,
   the memory module is separable from the cooling module through one or more physical-connection elements, and
   the memory module electrical connection is configured to communicatively couple the memory module to the cooling module through an electrical connection of the cooling module.

10. The ECU of claim 9, further comprising the cooling module, wherein:
the cooling module includes:
   the liquid-cooling circuit;
   the cooling module electrical connection; and
   the cooling module thermal-contact surface,
the cooling module electrical connection is configured to communicatively couple the memory module and the cooling module, and
the cooling module thermal-contact surface is in thermal contact with the memory module thermal-contact surface.

11. The ECU of claim 9, wherein the memory module does not include the liquid-cooling circuit or another liquid-cooling circuit.

12. The ECU of claim 9, wherein the memory of the memory module stores processor-executable instructions that, responsive to execution by the one or more computer processors, perform control functions to control one or more systems within a vehicle.

13. The ECU of claim 12, wherein:
the one or more systems within the vehicle is an assisted-driving system, and
the control functions enable at least one of self-driving or assisted-driving of the vehicle.

14. The ECU of claim 12, wherein:
the one or more systems within the vehicle is a braking system, and
the control functions enable at least one of automatic braking or electronic stability control of the vehicle.

15. The ECU of claim 12, wherein:
the one or more systems within the vehicle is a battery-management system, and
the control functions enable at least one of battery charging or battery-life extension.

16. The ECU of claim 12, wherein:
the one or more systems within the vehicle is a flight navigation system, and
the control functions enable auto-pilot functions.

17. The ECU of claim 12, wherein:
the one or more systems within the vehicle is at least one of a radar or lidar system, and
the control functions enable processing of a radar or lidar signal.

18. The ECU of claim 9, wherein;
the memory module does not include a vehicle electrical connection, and
the electrical connection of the cooling module is configured to receive communicative coupling with a vehicle.

19. The ECU of claim 9, wherein:
the memory module includes one or more vehicle electrical connections, and
the one or more vehicle electrical connections are configured to receive communicative coupling with a vehicle.

20. The ECU of claim 19, wherein the one or more vehicle electrical connections are further configured to enable at least one of receipt of power from the vehicle, receipt of sensor data from the vehicle, or provision of control functions from the memory module to the vehicle.

* * * * *